United States Patent [19]

Kinoshita

[11] Patent Number: 4,604,639
[45] Date of Patent: Aug. 5, 1986

[54] SEMICONDUCTOR MEMORY DEVICE
[75] Inventor: Hiroyuki Kinoshita, Tokyo, Japan
[73] Assignee: Tokyo Shibaura Denki Kabushiki Kaisha, Kawasaki, Japan
[21] Appl. No.: 564,370
[22] Filed: Dec. 23, 1983

Related U.S. Application Data

[63] Continuation of Ser. No. 224,013, Jan. 12, 1981, abandoned.

[30] Foreign Application Priority Data

Jan. 14, 1980 [JP] Japan .................................. 55-2871

[51] Int. Cl.[4] ............................................ H01L 29/93
[52] U.S. Cl. .................................... 357/23.6; 357/84; 357/29; 357/51; 357/41; 357/59
[58] Field of Search ................... 357/23.6, 29, 41, 51, 357/84, 23 C, 59

[56] References Cited

U.S. PATENT DOCUMENTS

| 3,387,286 | 6/1968 | Dennard | 357/23 C |
| 3,893,146 | 7/1975 | Heeren | 357/23 C |
| 4,012,757 | 3/1977 | Koo | 357/59 |
| 4,112,575 | 9/1978 | Fu et al. | 357/23 C |
| 4,131,906 | 12/1978 | Kinoshita | 357/23 C |
| 4,240,097 | 12/1980 | Raymond, Jr. | 359/59 |
| 4,323,405 | 4/1982 | Uno et al. | 357/29 |
| 4,376,983 | 3/1983 | Tsaur et al. | 365/182 |

FOREIGN PATENT DOCUMENTS 55-140250 11/1980 Japan .................................. 357/84

OTHER PUBLICATIONS

Itoh et al., "A High Speed 16K Bit n-MOS Random Access Memory", *IEEE Jour. of Solid-State Circuits,* vol. SC-11, No. 5, Oct. 1976.
Boll et al., IEEE J. of Solid State Circuits, vol. SC 8, No. 5, Oct. 1973, pp. 310-318.
May & Woods, Proc. 1978 International Reliability Physics Symposium, pp. 33-40.
IEEE Int. Electron Dev. Meeting, Dec. 1978, Tech. Digest, pp. 193-196, Dingwall et al.; see Especially the top of p. 195.
Electronics, Jun. 8, 1978, pp. 42-43.
"Alpha Particles May Be Cause of Soft Errors in Memory", 26 Electronic Design 37 (May 24, 1978).
Rideout et al., "A One-Device Memory Cell Using a Single Layer of Polycrystalline and a Self-Registering Metal-to-Polysilicon Contact", Tech. Dig. Int'l. Electronic Devices Meeting 258-261 (Dec. 5-7, 1977).
Meusburger, "A New Circuit Configuration for a Single Transistor Cell Using Al-Gate Technology with Reduced Dimensions", 12 IEEE J. Solid-State Circuits 253-257 (Jun. 1977).

*Primary Examiner*—Andrew J. James
*Assistant Examiner*—Charles S. Small, Jr.
*Attorney, Agent, or Firm*—Finnegan, Henderson, Farabow, Garrett & Dunner

[57] ABSTRACT

A semiconductor memory device comprising a semiconductor substrate of one conductivity type, memory cells each including a semiconductor impurity region of a conductivity type opposite to that of the substrate formed in the semiconductor substrate, a charge storage portion formed in the semiconductor substrate, and a gate portion to form a channel in the semiconductor substrate between the semiconductor impurity region and the charge storage portion, and a metal conductive layer. In order to reduce soft errors of the memory device caused by alpha particles from package materials, the metal conductive layer overlaying the charge storage portion is formed so as to have a width greater than the minimum width used in an integrated circuit at a portion thereof overlaying the substantial part of the charge storage portion.

8 Claims, 11 Drawing Figures

SEMICONDUCTOR MEMORY DEVICE

This application is a continuation, of application Ser. No. 224,013, filed Jan. 12, 1981 now abandoned.

This invention relates to a semiconductor integrated circuit, and, more specifically, to a semiconductor memory device provided with a charge storage portion.

In a dynamic random access memory (dRAM) which dynamically stores electrical charges, discrimination between data "1" and "0" is made on the basis of the presence or absence of charge on a capacitor. It is therefore essential to minimize dissipation of the capacitor charge due to leakage current. However, it has been revealed by T. C. May et al in the article entitled "A new physical mechanism for soft errors in dynamic memories", 16th annual proceedings of 1978 International Physics Symposium p.p. 33~40, that the charge on the capacitor may be dissipated to cause wrong operation also by alpha particles from infinitesimal amounts of uranium (U) or thorium (Th) present in packaging materials. Such wrong operation is called a soft error since it can be completely recovered by the following write cycle without lasting forever.

The mechanism for the soft error is as follows. Alpha particles emitted from an extremely small quantity (on the order of, for example, parts per million) of U or Th contained in ceramic, glass or plastic filler forming a package, penetrate the oxide film, polysilicon layers, and aluminum conductive layer of a semiconductor device to reach the silicon semiconductor substrate, and collide against Si crystals to form electron-hole pairs, as shown in FIG. 1. Some of the minority carriers (electrons in the case of p-type substrate, that is, n-channel device) of the electron-hole pairs are stored in a depletion layer at the surface portion of the semiconductor substrate forming one electrode of the capacitor of the memory cell, and change data "1" (minority carrier is absent) in the memory cell into data "0". At this time, the majority carriers (holes in the case of n-channel device) flow to the substrate.

Thus, soft errors are caused when the electron-hole pairs are produced by alpha-ray irradiation of the semiconductor substrate. The problem of such soft errors is becoming serious in view of the recent tendency toward large-capacity memories, that is, an increase in the number of memory cells with an accompanying reduction in the amount of charge stored in each memory cell. The following countermeasures for the soft errors will be contemplated.

(1) Improvement of package: To reduce the amount of U and Th contained in ceramic, glass and other materials.

(2) Modification of device design: To increase the amount of charge stored in each memory cell in order to reduce the influence of minority carriers.

(3) Chip coating: To apply a high molecular substance such as polyimide to the chip to prevent the incidence of alpha rays.

The countermeasure (1) involves an increase in package cost, while the countermeasure (2) requires an increase in the area of the storage capacitor or the memory cell area which is incompatible with the large-capacity design. With the countermeasure (3), the number of manufacturing steps is increased, possibly causing reliability problems. Accordingly, it is desired that the chip itself be made resistant to alpha rays without increasing the chip size or the number of manufacturing steps.

Alpha rays may cause wrong operations also in peripheral circuits, such as a sense amplifier or decoder, etc., as well as in the memory cells. However, the probability that wrong operations will happen in the peripheral circuits can be considered to be much lower than in the memory cells for the following reasons. First, in the peripheral circuits, the capacitance of MOS capacitors and hence the amount of stored charge are large. Second, the occupied area of the peripheral circuits is smaller than that of the memory cells, so that the probability of alpha rays being applied to those circuits is low. In the case of a dynamic memory, moreover, the refreshing interval of its peripheral circuits is shorter than that of the memory cells, so that the attenuation of charge is limited in the peripheral circuits. Accordingly, it is essential to work out a countermeasure for soft errors in the memmory cells.

An object of this invention is to provide a semiconductor memory device improved so as to be able to reduce the incidence of soft errors caused by alpha particles from packaging materials.

The above object of the invention is attained by forming a metal conductive layer disposed on a charge storage portion, which is formed of an inversion layer, a semiconductor impurity region or a combination of an inversion layer and a semiconductor impurity region, so that the area of the charge storage portion covered with the metal conductive layer is greater than that of the prior art memory device.

This invention can be more fully understood from the following detailed description when taken in conjunction with the accompanying drawings, in which:

FIG. 1 shows how electron-hole pairs are produced in a silicon semiconductor substrate by alpha ray irradiation;

FIGS. 2(A), 2(B) and 2(C) are a sectional view, top view, and circuit diagram of a prior art dynamic memory cell, respectively;

Prior to describing this invention with reference to the accompanying drawings, the construction of a prior art memory cell will be explained.

Figure 1:
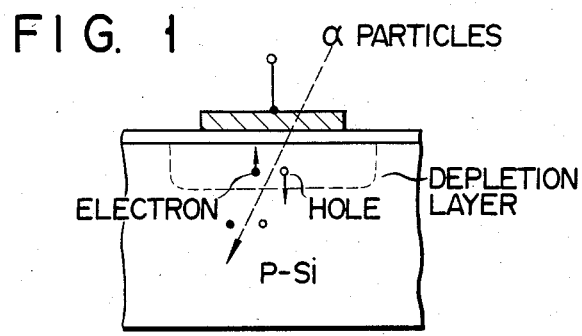
Figure 2A:
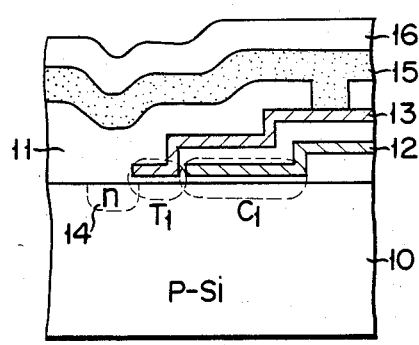
Figure 2B:
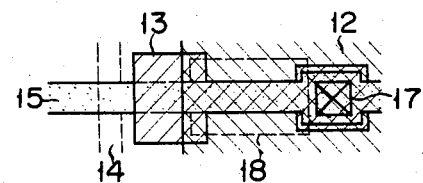
Figure 2C:
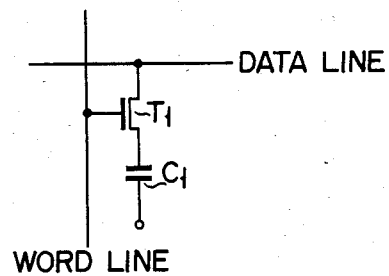

FIGS. 2(A), 2(B) and 2(C) are a sectional view, top view, and circuit diagram, respectively, of a single-transistor memory cell of a double-layer polysilicon structure which is used in the latest dRAM's and suited for large capacity construction. As shown in FIG. 2(C), the single-transistor memory cell is formed of a MOS transistor T1 and a storage capacitor C1. The transistor T1 has its gate connected to a word line for accessing the memory cell and its drain or source connected to a data line for data read or write operation. The capacitor C1 is connected between the source or drain of transistor T1 (whichever is not connected to the data line) and an information storage line (not shown) connected to a predetermined potential. By increasing the potential of the word line, the transistor T1 is turned on, so that data on the date line is written into the capacitor C1 or data on the capacitor C1 is read out onto the data line.

In FIG. 2(A) showing the construction of such memory cell, double polysilicon layers 12 and 13 are formed in an oxide film (SiO$_2$) 11 which is formed on the major surface of, for example a p-type silicon semiconductor substrate 10, and an n-type impurity diffusion region 14 serving as the data line is formed adjacent to these layers. A MOS capacitor C1 serving as a charge storage portion is formed by a thin portion of the oxide film between the polysilicon layer 12 forming the information storage line and an inversion layer on the surface of the substrate, and charge is stored on the surface portion of the substrate. The polysilicon layer 13 forming a gate electrode of, the impurity diffusion region 14, and the inversion layer of substrate surface (which is one electrode of the MOS capacitor C1) constitute the transistor T1. Namely, when the memory cell is accessed, an n-type channel is formed on the surface of the substrate 10 at a thin portion of the oxide film under the polysilicon layer 13, and the data line 14 is connected with the inversion layer of the MOS capacitor C1, allowing data to be transferred therebetween. The polysilicon layer 13 is electrically connected with an aluminum conductive layer 15 forming the word line extended over the data line 14 and the polysilicon layers 12 and 13 through a contact hole 17 in the oxide film 11. A protective film (usually phosphor glass) 16 is formed on the aluminum conductive layer 15.

Alpha particles from a package collide against the oxide film, polysilicon layers, and aluminum conductive layer to lose their energy. Nevertheless, the alpha particles can reach the semiconductor substrate since these layers are thin (oxide film: 1 to 2 microns, polysilicon layers: 0.4 to 0.7 micron in total, aluminum layer: 1.0 to 1.5 microns), and since the range of the alpha particles in the layers is relatively long. However, the energy of alpha particles lost in the oxide film and other layers ranges from 0.5 to 2 MeV, which accounts for a considerable percentage of the average alpha particle energy of about 5 MeV. Therefore, the number of electron-hole pairs produced in the semiconductor substrate is correspondingly reduced, decreasing soft error rate.

In the conventional memory cell structure as shown in FIG. 2(B), however, the word line 15 of the aluminum conductive layer is made narrow (normally 4 to 5 microns minimum width determined by the design regulations), except at a junction at contact hole 17 where it is connected with the polysilicon layer 13, in order to minimize the capacitance associated with the word line 15 for a high speed operation. Accordingly, the width of the aluminum conductive layer 15 is narrower than the width (12 to 13 microns) of the charge storage portion enclosed by a broken line 18, so that the rate of production of electron-hole pairs becomes higher in the region of the charge storage portion which is not overlaid with the aluminum conductive layer than in the overlaid region thereof. Incidentally, the portion of alumunum conductive layer 15 around the contact hole 17 which slightly covers an end portion of the charge storage portion 18 is approximately 10 microns in width.

Figure 3:
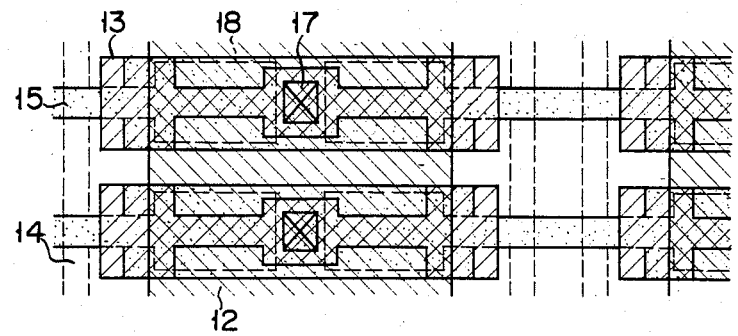
FIGS. 3 to 6 are top views of dynamic memory cells according to this invention.

FIG. 3 is a top view of a semiconductor memory according to an embodiment of this invention. The semiconductor memory of this embodiment has a conventional construction in which a memory cell is disposed on one side of a data line 14, and two memory cells are arranged in a line between two adjacent data lines. In this construction, however, an aluminum conductive layer 15 is formed wider at that portion thereof which overlies the charge storage portion 18 so that the area of the charge storage portion overlaid with the aluminum conductive layer 15 may be enlarged as compared with the prior art construction. Thus, the energy of alpha rays coming into the charge storage portion is always attenuated to reduce the production of electron-hole pairs.

The aluminum conductive layer (word line) 15 is preferably formed as wide as possible in the area over the charge storage portion within a range (normally 4 to 5 microns minimum interval determined by the design regulations) to keep the layer 15 apart from another word line connected with an adjacent memory cell. In the example of FIG. 3, the minimum interval provided by the design regulations is applied to the interval between two adjacent aluminum conductive layers, and the aluminum conductive layer 15 is formed wider than the charge storage portion to cover the whole surface of the charge storage portion. However, this invention is not limited to such construction. For example, the width of the aluminum conductive layer 15 at the portion thereof overlaying the substantial part of the charge storage portion (herein defined as a region of the charge storage portion except the portion thereof overlaid with the aluminum conductive layer around the contact hole 17 as shown in FIG. 2(B)) may be equal to or greater than the width of the contact hole region. Alternatively, the width of the aluminum conductive layer 15 at the portion over the substantial part of the charge storage portion may be only greater than the minimum width (4 to 5 microns) used in an integrated circuit as provided in the design regulations.

Further, although the word line 15 may be widened until it crosses a portion on the data line 14, it is advisable to narrow the word line 15 at the middle portion of the transistor section under the polysilicon layer 13, as shown, for the reduction in the data line capacitance as well as in coupling noise. It is only necessary that some allowance be made for a deviation in mask alignment between the polysilicon layer 12 and the aluminum conductive layer 15.

With the construction of this invention, the alpha particles are caused to lose more energy in the aluminum conductive layer over the change storage portion of the memory cell, as compared with the conventional cell. The aluminum conductive layer is relatively thick- —1.0 to 1.5 microns, and the alpha particles lose their energy by 0.3 to 0.5 MeV in this layer, so that the energy of alpha particles to reach the charge storage portion is reduced as compared with the case of the prior art memory cell as shown in FIG. 2. When the energy of the alpha particles is reduced, the amount of minority carriers produced in the substrate will be decreased. Owing to the critical amount of charge (for discrimination between "1"and "0") in the memory cell, however, the soft errors are reduced at a rate higher than the rate at which the alpha particles lose their energy. According to an experiment in which alpha rays were applied from an alpha ray source for 10 minutes the soft error occurred twice or thrice with a 16-k dRAM of the conventional construction as shown in FIG. 2(B), whereas it occurred 0.3 or 0.4 time with use of the construction of the invention. The load capacitance of the word line is dominated by the capacitance of the transistor section, and an increase in capacitance due to the enlargement of the word line is limited to approximately 2 to 10%, so that the reduction of switching speed, as well as the increase of power consumption, can be suppressed to a very small extent.

Thus, according to this invention, the erroneous operation due to soft errors may be reduced without requiring any changes in manufacturing processes or involving any reliability problems.

In the aforementioned embodiment, alpha rays may be inhibited more effectively by adding copper to aluminum as a countermeasure for migration or by substituting molybdenum for aluminum. Further, the diffusion of minority carriers in the semiconductor substrate produced by alpha rays may be checked if the lifetime of the minority carriers is shortened by injecting a lifetime killer into the crystal of the semiconductor substrate except the surface portion thereof to a depth of several microns where the MOS transistor and the impurity diffusion region are formed.

Figure 4:
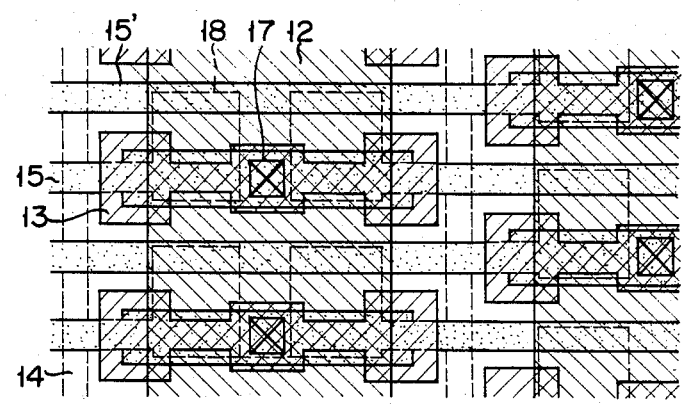

FIG. 4 shows another embodiment in which memory cells are alternately arranged on both sides of each data line 14. In this embodiment, a word line 15 has a greater width at a portion overlaying the substantial part of its corresponding charge storage portion 18. Namely, the width at such pprtion is equal to the width of word line 15 in the region of contact hole 17. In this semiconductor memory, since two word lines 15 and 15' are arranged for each memory cell, the charge storage portion 18 is formed asymmetrically with respect to the word line 15 so that one end portion of the charge storage portion 18 may be overlaid with the adjacent word line 15'. Although less effective than the memory cell of FIG. 3, the embodiment of FIG. 4 is more effective than the prior art memory cell in which the word line is narrow and the charge storage portion is not overlaid with the adjacent word line.

Figure 5:
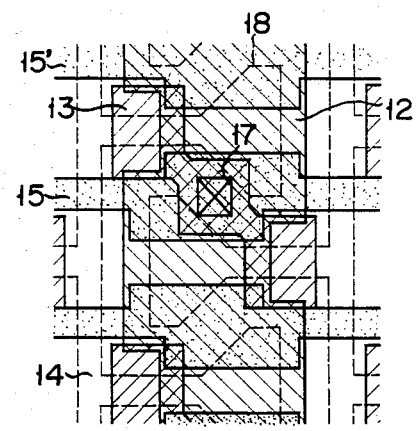

FIG. 5 shows an embodiment in which memory cells are alternately arranged on both sides of each data line, and a memory cell is disposed between two adjacent data lines. In the conventional memory cell of this type, the charge storage portion is not significantly overlaid with the word line. In the embodiment of this invention, however, a charge storage portion 18 is overlaid with its corresponding word line 15, which is formed wide at either side of the region at contact hole 17, and with an adjacent word line 15' formed in like manner. Thus, the area of the charge storage portion overlaid with the word lines is enlarged.

Figure 6:
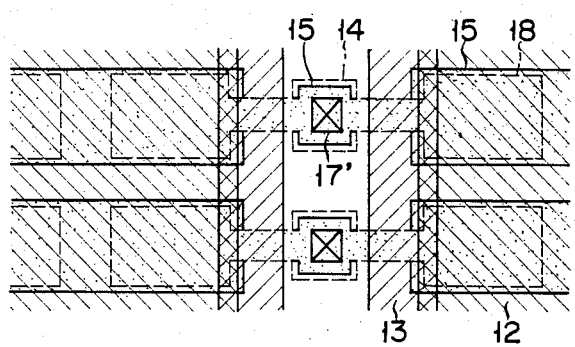

Although in the foregoing embodiments the word and data lines are formed of the aluminum conductive layer and the impurity diffusion region respectively, they may also be formed of a polysilicon layer 13 and an aluminum conductive layer 15 respectively, as shown in FIG. 6. In the embodiment of FIG. 6, the aluminum conductive layer 15 overlaying a charge storage portion 18 is electrically connected with an impurity diffusion layer 14 at a contact hole 17'. Although the aluminum conductive layer 15 is formed wider than the charge storage portion 18 so as to cover the whole surface of the charge storage portion 18, it is only necessary that the width of the aluminum conductive layer 15 be greater than the minimum width provided in the design regulations, as mentioned in connection with the embodiment of FIG. 3. The embodiment of FIG. 6 is disadvantageous in that the capacitance of the data line made of the aluminum conductive layer is increased to reduce a signal voltage.

Figure 7:
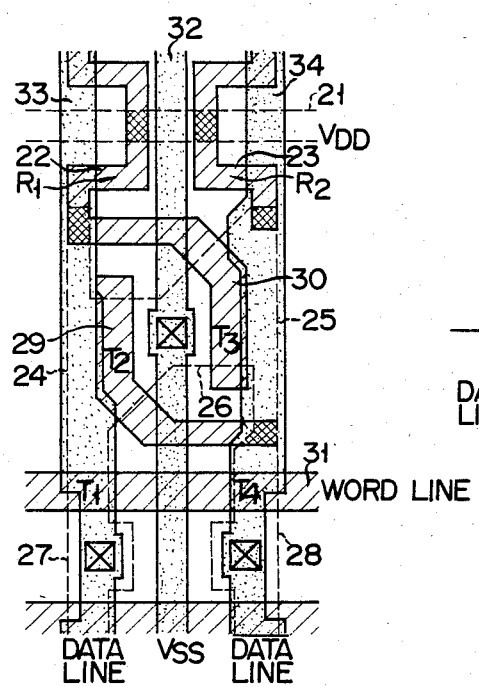
FIG. 7 is a top view of a static memory cell according to the invention.
Figure 8:
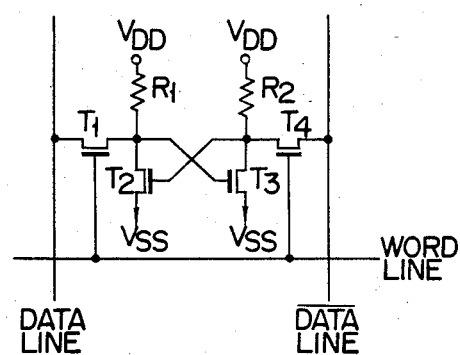
FIG. 8 is a circuit diagram showing the static memory cell of FIG. 7.

FIG. 7 shows an embodiment in which the invention is applied to a static random access memory (sRAM) including a flip-flop circuit as shown in FIG. 8. In the flip-flop circuit of FIG. 8, cross-coupled transistors T2 and T3 are connected to a high-voltage power source $V_{DD}$ through load resistors R1 and R2. The outputs of the flip-flop circuit are connected to a pair of data lines through transfer transistors T1 and T4, whose gates are connected to a word line.

In the latest sRAM's, high resistance is provided by forming the load resistors R1 and R2 of a polysilicon layer in order to reduce power consumption. Therefore, the current supplied to the flip-flop circuit is approximately 0.01 to 10 nA at room temperature, and even the sRAM may be affected by minority carriers produced by alpha rays.

In the embodiment of FIG. 7, the transistors and load resistors are formed of a single polysilicon layer. Polysilicon layers 22 and 23 forming the load resistors R1 and R2 are connected to a $V_{DD}$ power source line 21 formed of an impurity diffusion region, and connected at the other ends to impurity diffusion regions 24 and 25 as well as polysilicon layers 30 and 29 to form the flip-flop transistors T3 and T2, respectively. The polysilicon layers 22, 23, 29 and 30 are electrically connected with the impurity diffusion layers 21, 24 and 25 at reticulated portions in FIG. 7. The impurity diffusion region 26 is connected with a $V_{SS}$ power source line 32 formed of an aluminum conductive layer between the polysilicon layers 29 and 30. Data lines 33 and 34 formed of aluminum conductive layers are connected respectively with impurity diffusion regions 27 and 28 forming the transfer transistors T1 and T4 under a word line 31 made of a polysilicon layer, and are wired in a manner to extend upward.

Since the soft error is caused when the minority carriers produced by the alpha ray irradiation are trapped in a depletion layer of the impurity diffusion region (or inversion layer) in the charge storage portion, it is only necessary that the aluminum conductive layer overlie not the gate (large in capacitance) of the transistor as the main charge storage portion but the impurity diffusion region of the charge storage portion. As shown in FIG. 7, therefore, the impurity diffusion regions 24 and 25 which extend from the high-resistance polysilicon layers 22 and 23 to the word line 31 and form the output section of the flip-flop circuit need be overlaid respectively with the aluminum conductive layers 33 and 34. In other words, those portions of the aluminum conductive layers 33 and 34 which extend from the polysilicon layers 22 and 23 to the word line 31 are formed wider than the minimum width provided in the design regulations to cover the whole surface of the output section of the flip-flop circuit. Although the charge storage portion is overlaid with the data line of the aluminum conductive layer in this embodiment, the aluminum conductive layer overlaying the charge storage portion is not limited to the data line.

In the circuit dynamically storing charges or supplied with small current, as described above, the incidence of soft errors caused by alpha ray irradiation may be reduced by increasing the area of an impurity diffusion region or an inversion layer serving as a charge storage portion to be overlaid with a metal conductive layer as compared with the case of the prior art circuit.

Figure 9:
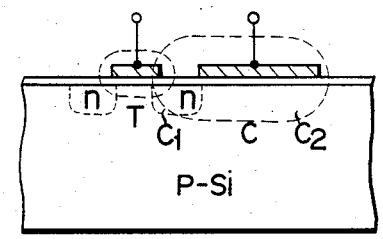
FIG. 9 is a diagram showing a case where a charge storage portion is formed of an impurity diffusion region and an inversion layer.

Although in the aforementioned embodiments the charge storage portion of the semiconductor substrate is formed of an impurity diffusion region or an inversion layer, it is to be understood that this invention may also be applied to a case where the charge storage portion is formed of an impurity diffusion region and an inversion layer. FIG. 9 shows the case in which a charge storage portion C is formed of an impurity region C1 and an inversion layer C2. Thus, this invention comprises all cases where the charge storage portion is formed of an impurity diffusion region, where it is formed of an inversion region, and where it is formed of an impurity diffusion region and an inversion layer.

According to this invention, moreover, a high-reliability semiconductor memory device can be obtained without increasing the chip size or the number of manufacturing processes.

Although a single-transistor memory cell using a transistor and a capacitor and a static memory cell of a load-resistance type have been described in detail herein, it is to be understood that this invention may be applied also to dynamic memory cells, such as three- or four-transistor memory cells, and other static memories. It is to be understood, moreover, that the metal conductive layers are not limited to ones which are arranged in a manner to extend on a chip, and that they may be disposed only on the impurity diffusion region and/or inversion layer forming the charge storage portion.

What is claimed is:

1. In a semiconductor device having a plurality of memory cells each coupled to a data line and having a word line, each memory cell being formed on a semiconductor substrate of a first conductivity type, said data line being formed of a semiconductor impurity region of a second conductivity type opposite to said first conductivity type formed in said semiconductor substrate, and each memory cell including a charge storage portion formed in said semiconductor substrate and a gate portion for forming a channel in said semiconductor substrate between said semiconductor impurity region and said charge storage portion, said word line being a metal conductive layer formed on said semiconductor substrate to overlie said charge storage portion and connected to said gate portion at a junction, said word line and said data line crossing each other with an insulating layer therebetween, the improvement wherein said word line has a first portion overlying said charge storage portion and a second portion overlying said data line, said first portion of said word line being of a width such that it completely overlies said charge storage portion, in width of said first portion being greater than the width of said second portion.

2. A semiconductor memory device having a plurality of memory cells each coupled to a data line and having a word line, each memory cell comprising:
  (a) a semiconductor substrate of a first conductivity type;
  (b) a semiconductor impurity region of a second conductivity type opposite to said first conductivity type formed in said semiconductor substrate;
  (c) a charge storage portion formed in said semiconductor substrate;
  (d) a gate portion coupled to said word line and formed on said semiconductor substrate between said semiconductor impurity region and said charge storage portion to form a channel therebetween; and
  (e) a data line of a metal conductive layer connected to said semiconductor impurity region at a junction and formed on said semiconductor substrate to completely overlay said charge storage portion.

3. A semiconductor memory device according to claim 1, wherein a part of said charge storage portion is overlaid with another word line coupled to another memory cell.

4. In a semiconductor memory device having a plurality of memory cells each coupled to a word line and having first and second data lines, the data lines being metal conductive layers formed on a semiconductor substrate and each of the memory cells having first and second MOS transistors each having a drain, a source, and a gate, the sources of the first and second MOS transistors being connected to a reference potential point and the drains of the first and second MOS transistors being coupled respectively to the gates of the second and first MOS transistors at first and second output nodes, first and second resistors respectively connecting the first and second output nodes to a power supply, and third and fourth MOS transistors each having a drain, a source, and a gate, the gates of the third and fourth MOS transistors being connected to the word line, the source-drain path of the third MOS transistor being connected between the first output node and the first data line, and the source-drain path of the fourth MOS transistor being connected between the second output node and the second data line, each of the nodes comprising a semiconductor impurity region formed in the semiconductor substrate to store electric charge, the improvement wherein said impurity regions are formed to extend in parallel with each other, and said first and second data lines are formed so as to completely overlay said impurity regions forming said output nodes.

5. A device as recited in claim 2 wherein said metal layer is formed of aluminum.

6. A device as recited in claim 2 wherein said charge storage portion is formed of an inversion layer.

7. A device as recited in claim 2 wherein said charge storage portion is formed of a semiconductor impurity region.

8. A device as recited in claim 2 wherein said charge storage portion is formed of a semiconductor impurity region and an inversion layer.

* * * * *